United States Patent
Kim et al.

(10) Patent No.: US 10,453,527 B1
(45) Date of Patent: *Oct. 22, 2019

(54) IN-CELL DIFFERENTIAL READ-OUT CIRCUITRY FOR READING SIGNED WEIGHT VALUES IN RESISTIVE PROCESSING UNIT ARCHITECTURE

(71) Applicant: International Business Machines Corporation, Armonk, NY (US)

(72) Inventors: Seyoung Kim, White Plains, NY (US); Hyung-Min Lee, Seoul (KR); Tayfun Gokmen, Briarcliff Manor, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/352,230

(22) Filed: Mar. 13, 2019

Related U.S. Application Data

(63) Continuation of application No. 15/941,558, filed on Mar. 30, 2018.

(51) Int. Cl.
| | |
|---|---|
| *G11C 13/00* | (2006.01) |
| *G06N 3/063* | (2006.01) |
| *G06N 3/08* | (2006.01) |

(52) U.S. Cl.
CPC ......... *G11C 13/004* (2013.01); *G06N 3/0635* (2013.01); *G06N 3/084* (2013.01); *G11C 13/0038* (2013.01); *G11C 2013/0042* (2013.01)

(58) Field of Classification Search
CPC .. G11C 13/004; G06N 3/0063; G06N 3/0635; G06N 3/084
See application file for complete search history.

(56) References Cited

U.S. PATENT DOCUMENTS

| | | |
|---|---|---|
| 7,286,429 B1 | 10/2007 | Liaw et al. |
| 9,070,424 B2 | 6/2015 | Youn et al. |

(Continued)

FOREIGN PATENT DOCUMENTS

| | | |
|---|---|---|
| KR | 10-2017-0108627 A | 9/2017 |
| TW | 200611492 A | 4/2006 |
| TW | 201727656 A | 8/2017 |

OTHER PUBLICATIONS

English translation for Korean Application No. KR1020170108627A.

(Continued)

*Primary Examiner* — Huan Hoang
*Assistant Examiner* — Jay W. Radke
(74) *Attorney, Agent, or Firm* — L. Jeffrey Kelly; Ryan, Mason & Lewis, LLP

(57) ABSTRACT

A resistive processing unit (RPU) device includes a weight storage device to store a weight voltage which corresponds to a weight value of the RPU device, and a read transistor having a gate connected to the weight storage device, and first and second source/drain terminals connected to first and second control ports, respectively. A current source connected to the second source/drain terminal generates a fixed reference current. The read transistor generates a weight current in response to the weight voltage. A read current output from the second control port represents a signed weight value of the RPU device. A magnitude of the read current is equal to a difference between the weight current and the fixed reference current. The sign of the read current is positive when the weight current is greater than the fixed reference current, and negative when the weight current is less than the fixed reference current.

20 Claims, 7 Drawing Sheets

(56) References Cited

U.S. PATENT DOCUMENTS

| | | | |
|---|---|---|---|
| 9,087,578 | B2 | 7/2015 | Vimercati et al. |
| 9,224,464 | B2 | 12/2015 | Chou et al. |
| 9,472,245 | B2 | 10/2016 | Lee et al. |
| 9,508,233 | B2 | 11/2016 | Kelly et al. |
| 9,530,114 | B2 | 12/2016 | King et al. |
| 9,617,011 | B2 | 4/2017 | Derenick et al. |
| 9,852,790 | B1 | 12/2017 | Gokmen et al. |
| 2014/0056059 | A1 | 2/2014 | Mueller et al. |
| 2014/0153313 | A1 | 6/2014 | Boujamaa et al. |
| 2018/0114572 | A1 | 4/2018 | Gokmen et al. |
| 2018/0138401 | A1 | 5/2018 | Ando et al. |
| 2018/0253642 | A1 | 9/2018 | Gokmen et al. |
| 2019/0005382 | A1 | 1/2019 | Li et al. |

OTHER PUBLICATIONS

English translation for Taiwan Application No. TW201727656A.
English translation for Taiwan Application No. TW200611492A.
O. Krestinskaya et al., "Memristor Load Current Mirror Circuit," International Conference on Advances in Computing, Communications and Informatics (ICACCI), Aug. 10-13, 2015, pp. 538-542.
S. Kim et al., "Analog CMOS-Based Resistive Processing Unit for Deep Neural Network Training," IEEE 60th International Midwest Symposium on Circuits and Systems (MWSCAS), Aug. 6-9, 2017, 4 pages.
C.G. Looney, "Advances in Feedforward Neural Networks: Demystifying Knowledge Acquiring Black Boxes," IEEE Transactions on Knowledge and Data Engineering, pp. 211-226, Apr. 1996, vol. 8, No. 2.
T. Gokmen et al., "Acceleration of Deep Neural Network Training with Resistive Cross-Point Devices: Design Considerations," Frontiers in Neuroscience, Jul. 2016, pp. 1-13, vol. 10, No. 333.
P.T. Elliott et al., "Training Reformulated Product Units in Hybrid Neural Networks," International Joint Conference on Neural Networks (IJCNN), Jul. 16-21, 2006, pp. 5051-5058.
H. Kim et al., "Neural Synaptic Weighting with a Pulse-Based Memristor Circuit," IEEE Transactions on Circuits and Systems 1: Regular Papers, Jan. 2012, pp. 148-158, vol. 59, No. 1.
K.J. Miller et al., "Habits without Values," bioRxiv 067603, Aug. 3, 2016, 24 pages.
S.M.A. Mokhtar et al., "Write and Read Circuit for Memristor Analog Resistance Switching," IEEE 8th Control and System Graduate Research Colloquium (ICSGRC), Aug. 4-5, 2017, pp. 13-16.
List of IBM Patents or Patent Applications Treated as Related.

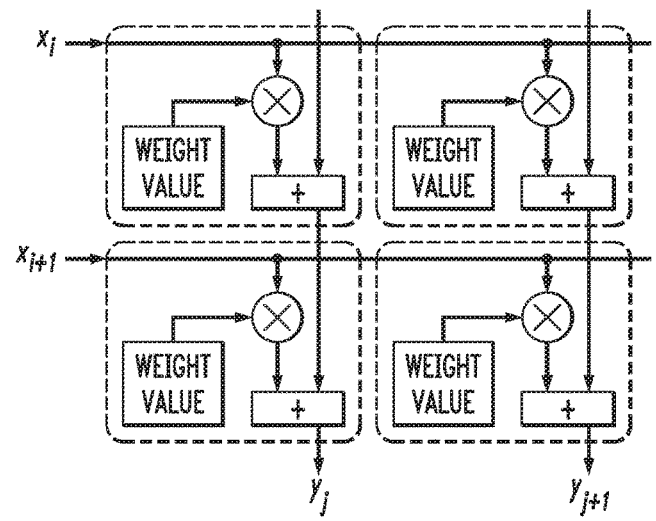
FIG. 2A  $y = W \times x$  FORWARD PASS
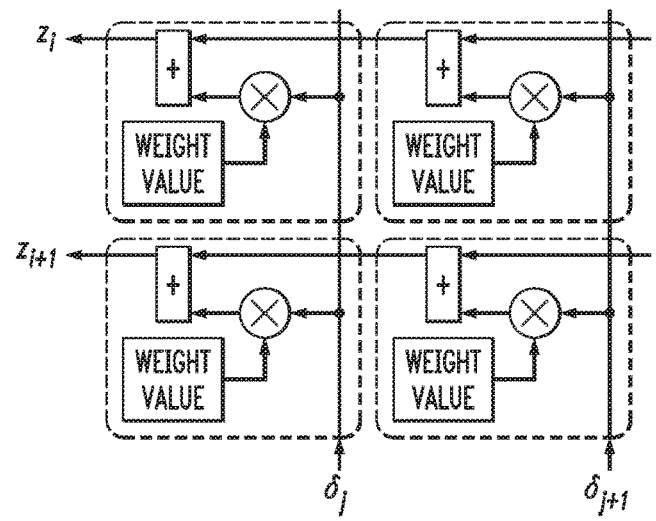
FIG. 2B  $z = W^T \times \delta$  BACKWARD PASS
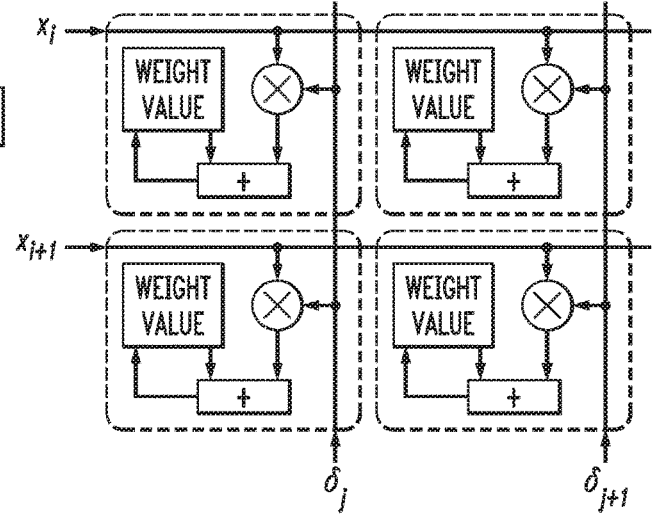
FIG. 2C  $w_{ij} \leftarrow w_{ij} + \eta x_i \times \delta_j$  WEIGHT UPDATE

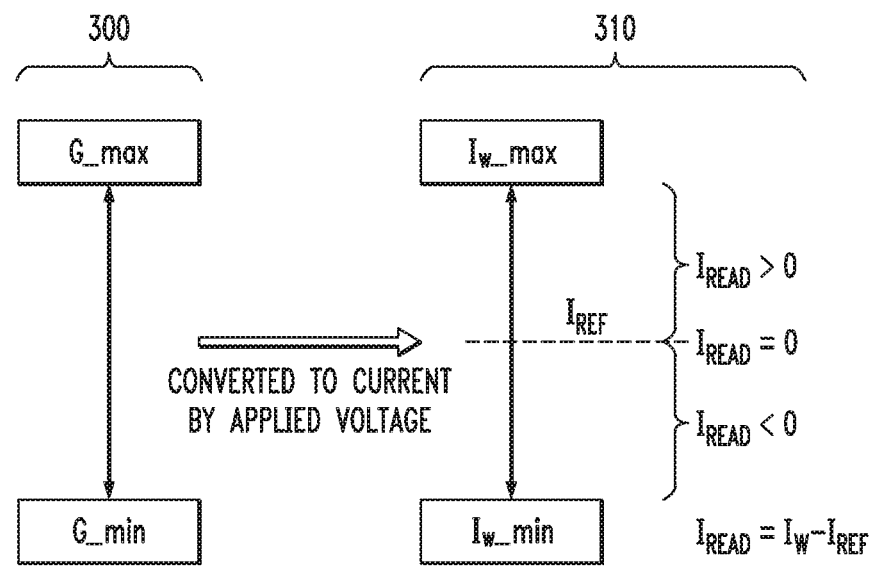
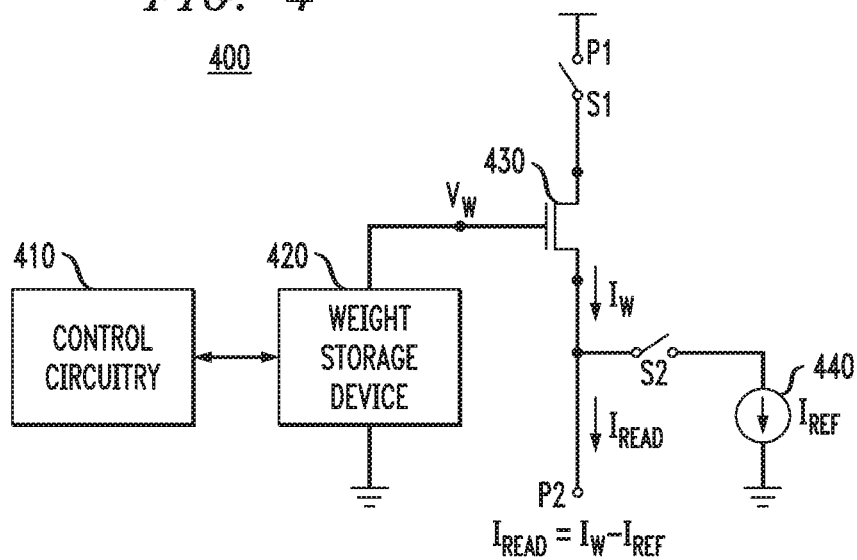

700

800

US 10,453,527 B1

IN-CELL DIFFERENTIAL READ-OUT CIRCUITRY FOR READING SIGNED WEIGHT VALUES IN RESISTIVE PROCESSING UNIT ARCHITECTURE

TECHNICAL FIELD

This disclosure generally relates to resistive processing unit (RPU) frameworks and, in particular, techniques for reading weight values stored in RPU storage cells.

BACKGROUND

In recent years, deep neural network (DNN) based models have made significant progress due to the availability of large labeled datasets and continuous improvements in computation resources. DNNs are utilized in various applications including, for example, object/speech recognition, language translation, pattern extraction, and image processing. The quality of the DNN models depends on the processing of a large amount of training data and an increased complexity of the neural network. In this regard, training a complex DNN model is a time consuming and computationally intensive task which can require many days or weeks to perform using parallel and distributed computing frameworks with many computing nodes (e.g., datacenter-scale computational resources) to complete the training of the DNN model.

To reduce training time, hardware acceleration techniques for processing DNN workloads have been pursued either in conventional CMOS technologies or by using emerging non-volatile memory (NVM) technologies. However, it has been found that resistive processing unit (RPU) accelerator devices have the potential to accelerate DNN training by orders of magnitude, while using less power, as compared to conventional hardware acceleration techniques. DNN training generally relies on a backpropagation algorithm which includes three repeating cycles: forward, backward and weight update. It has been determined that RPU accelerator devices which are based on a two-dimensional (2D) crossbar array of RPU storage cells, can be configured to perform all three cycles of the backpropagation algorithm in parallel, thus potentially providing significant acceleration in DNN training with lower power and reduced computation resources compared to state-of-the-art implementations using central processing units (CPUs) and graphics processing units (GPUs). An RPU accelerator can store and update weight values locally, thereby minimizing data movement during training and fully exploiting the locality and the parallelism of the DNN training process. Analog weight storage elements in RPU storage cells are capable of storing weight values without sign (e.g., positive, negative, zero). However, RPU operations for DNN training and other applications require processing of positive, zero and negative weight values.

SUMMARY

Embodiments of the invention include in-cell differential read-out circuits and methods to enable signed weight values to be directly read out from RPU cells of an RPU system.

For example, one embodiment includes an RPU device, which comprises: a weight storage device configured to store a weight voltage which corresponds to a weight value of the RPU device; a read transistor comprising a gate terminal, a first source/drain terminal, and a second source/drain terminal, wherein the gate terminal is connected to the weight storage device, wherein the first source/drain terminal is connected to a first control port of the RPU device, and wherein the second source/drain terminal is connected to a second control port of the RPU device; and a current source connected to the second source/drain terminal of the read transistor. The current source is configured to generate a fixed reference current. The read transistor is configured to generate a weight current in response to the weight voltage applied to the gate terminal of the read transistor. The RPU device is configured to output a read current from the second control port, wherein the read current comprises a magnitude and sign which represents a signed weight value of the RPU device. The magnitude of the read current is equal to a difference between the weight current generated by the read transistor and the fixed reference current of the current source. The sign of the read current is deemed positive when the weight current is greater than the fixed reference current, and the sign of the read current is deemed negative when the weight current is less than the fixed reference current.

Another embodiment includes an RPU device, which comprises: a weight storage device configured to store a weight voltage which corresponds to a weight value of the RPU device; a current integration circuit; a first read transistor comprising a gate terminal, a first source/drain terminal, and a second source/drain terminal, wherein the gate terminal is connected to the weight storage device, wherein the first source/drain terminal is connected to a first control port of the RPU device, and wherein the second source/drain terminal is connected to the current integration circuit; and a second read transistor comprising a gate terminal, a first source/drain terminal, and a second source/drain terminal, wherein the gate terminal is connected to the weight storage device, wherein the first source/drain terminal is connected to a second control port of the RPU device, and wherein the second source/drain terminal is connected to the current integration circuit. The first and second read transistors are configured to generate first and second weight currents, respectively, in response to the weight voltage applied to the gate terminals of the first and second read transistors, wherein the first and second weight currents are complementary currents. The current integration circuit is configured to generate a read current, which is output from a third port of the RPU device, wherein the read current comprises a magnitude and sign which represents a signed weight value of the RPU device. The magnitude of the read current is equal to a difference between the first weight current generated by the first read transistor and the second weight current generated by the second read transistor. The sign of the read current is deemed positive when the first weight current is greater than the second weight current, and the sign of the read current is deemed negative when the first weight current is less than the second weight current.

Another embodiment includes an RPU device, which comprises: a current mirror circuit comprising a reference input node and an output node; a variable resistor device having a resistance value which corresponds to a weight value of the RPU device, wherein the variable resistor device is connected between a first port and a second port of the RPU device, and connected to the output node of the current mirror circuit; and a fixed resistor device having a fixed resistance value, wherein the fixed resistor device is connected between the first port of the RPU device and the reference input node of the current mirror circuit. The variable resistor device is configured to generate a first current in response to a control voltage applied to the first port of the RPU device. The fixed resistor device is configured to generate a second current in response to the control voltage applied to the first port of the RPU device. The current mirror circuit is configured to mirror the second current, and sink the mirrored second current into the output node of the current mirror circuit and cause a read current to be generated and output from the second port of the RPU device. The read current comprises a magnitude and sign which represents a signed weight value of the RPU device. The magnitude of the read current is equal to a difference between the first current the second mirrored current. The sign of the read current is deemed positive when the first current is greater than the second mirrored current, and the sign of the read current is deemed negative when the first current is less than the second mirrored current.

Other embodiments will be described in the following detailed description of embodiments, which is to be read in conjunction with the accompanying figures.

BRIEF DESCRIPTION OF THE DRAWINGS

FIG. 2A schematically illustrates a forward pass operation of a backpropagation process, which can be performed using the RPU system of FIG. 1.

FIG. 2B schematically illustrates a backward pass operation of a backpropagation process, which can be performed using the RPU system of FIG. 1.

FIG. 2C schematically illustrates a weight update operation of a backpropagation process, which can be performed using the RPU system of FIG. 1.

FIG. 3 conceptually illustrates a process for utilizing a reference current source within an RPU cell to implement a differential read scheme which enables signed weight values to be directly read out from the RPU cell, according to an embodiment of the invention.

FIG. 4 schematically illustrates an RPU cell framework which implements a differential read scheme using a reference current source to enable signed weight values to be directly read out from the RPU cell, according to an embodiment of the invention.

DETAILED DESCRIPTION OF EMBODIMENTS

Embodiments of the invention will now be discussed in further detail with regard to in-cell differential read-out circuits and methods which enable signed weight values to be directly read out from RPU cells of an RPU system. It is to be noted that the same or similar reference numbers are used throughout the drawings to denote the same or similar features, elements, or structures, and thus, a detailed explanation of the same or similar features, elements, or structures will not be repeated for each of the drawings.

Figure 1:
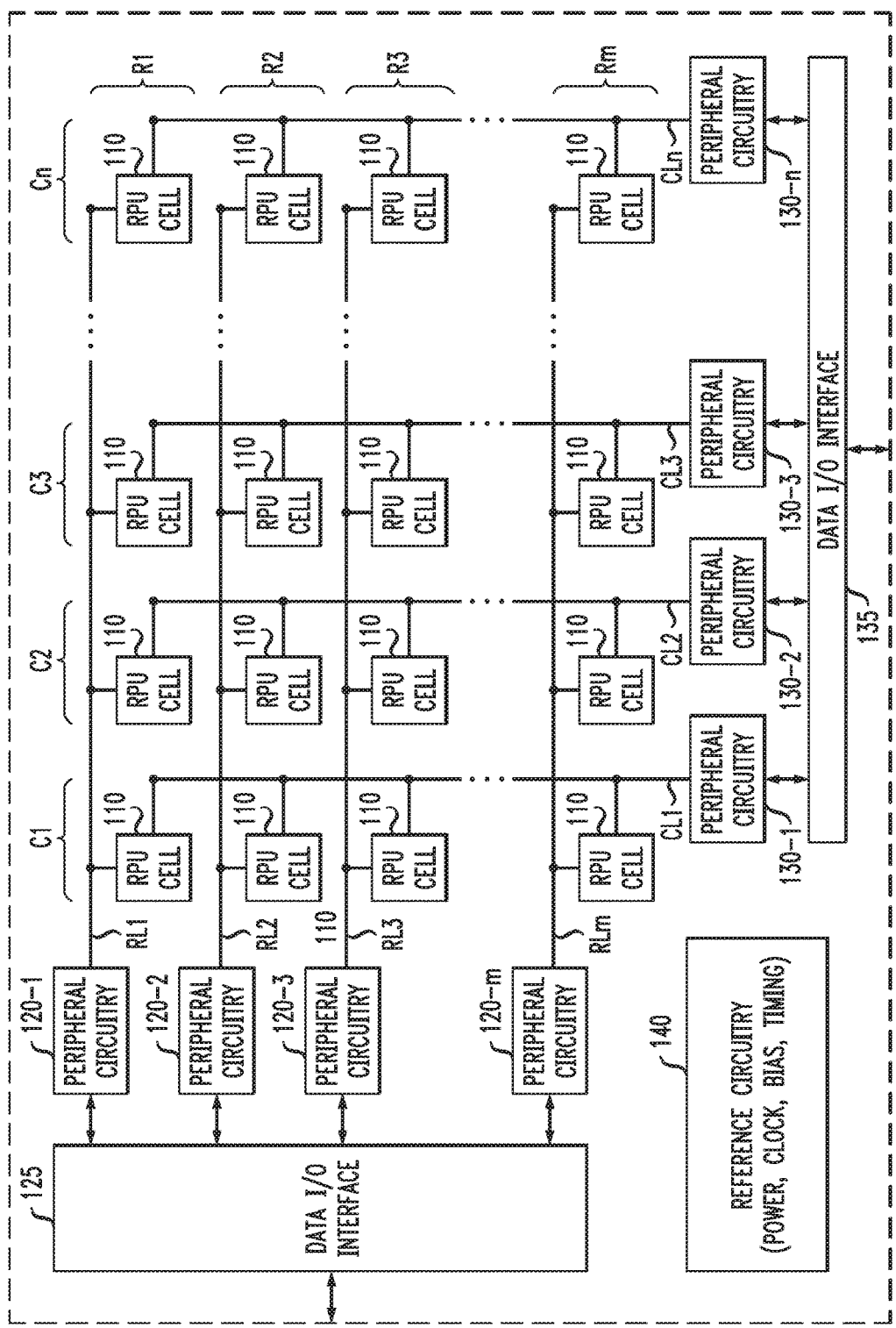
FIG. 1 schematically illustrates a resistive processing unit system which can be implemented using RPU cell architectures according to embodiments of the invention.

FIG. 1 schematically illustrates a RPU system 100 which can be implemented using RPU cell architectures according to embodiments of the invention. The RPU system 100 comprises a two-dimensional (2D) crossbar array of RPU cells 110 arranged in a plurality of rows R1, R2, R3, . . . , Rm, and a plurality of columns C1, C2, C3, . . . , Cn. The RPU cells 110 in each row R1, R2, R3, . . . , Rm are commonly connected to respective row control lines RL1, RL2, RL3, . . . , RLm (collectively, row control lines RL). The RPU cells 110 in each column C1, C2, C3, . . . , Cn are commonly connected to respective column control lines CL1, CL2, CL3, . . . , CLn (collectively, column control lines CL). Each RPU cell 110 is connected at (and between) a cross-point (or intersection) of a respective one of the row and column control lines.

The RPU system 100 further comprises separate blocks of peripheral circuitry 120-1, 120-2, 120-3, . . . , 120-m (collectively, peripheral circuitry 120) connected to respective row control lines RL1, RL2, RL3, RLm, as well as separate blocks of peripheral circuitry 130-1, 130-2, 130-3, . . . , 130-n (collectively, peripheral circuitry 130) connected to respective column control lines CL1, CL2, CL3, . . . , CLn. Further, each block of peripheral circuitry 120-1, 120-2, 120-3, . . . , 120-m (for the rows) is connected to a data input/output (I/O) interface block 125. Similarly, each block of peripheral circuitry 130-1, 130-2, 130-3, . . . , 130-n (for the columns) is connected to a data I/O interface block 135. The RPU system 100 further comprises reference circuitry 140 which comprises various types of circuit blocks such as power, clock, bias and timing circuitry to provide power distribution and control signals and clocking signals for operation of the RPU system 100.

In some embodiments, the RPU system 100 is configured to perform DNN computations wherein a conductance of each RPU cell 100 represents a matrix element or weight, which can be updated or accessed through operations of the peripheral circuitry 120 and 130. As noted above, DNN training generally relies on a backpropagation process which comprises three repeating cycles: a forward cycle, a backward cycle, and a weight update cycles. The RPU system 100 can be configured to perform all three cycles of the backpropagation process in parallel, thus potentially providing significant acceleration in DNN training with lower power and reduced computation resources. The RPU system 100 can be configured to perform vector-matrix multiplication operations in the analog domain in a parallel manner, which leads to a significant enhancement in performance (e.g., 10K× or more) as compared to a counterpart CPU/GPU implementation.

While the row control lines RL and column control lines CL are each shown in FIG. 1 as a single line for ease of illustration, it is to be understood that the row and column control lines can include two or more control lines connected to the RPU cells 110 in the respective rows and columns, depending on the implementation. For example, in one embodiment, each row control line RL and each column control line CL comprises a pair of control lines, including an "Update" control line, and a "Read" control line, wherein the cell conductance (e.g., weight value) of a given RPU cell 100 can be adjusted and sensed through the Update and Read control lines, respectively, for a given row and column connected to the given RPU cell 110.

In some embodiments, each block of peripheral circuitry 120 and 130 comprises essentially the same set of circuit blocks connected to the respective rows and columns in the 2D array of RPU cells 110 to perform forward, backward and update operations for a backpropagation process. For example, in one embodiment, to support a RPU cell update operation (e.g., update weight value of given RPU cell 110), each block of peripheral circuitry 120 and 130 comprise a stochastic pulse generator block and an update pulse driver block, which are responsive to update vectors that are received during a weight update cycle, to generate and apply a series of stochastically populated pulses to control circuitry within a given RPU cell 110 to update with weight value of the given RPU cell 110. The stochastic pules are transmitted on the Update control lines to control circuitry within the given RPU cell 110 to perform various operations (e.g., multiplication) to update a stored weight value within the RPU cell 110 using known techniques.

In addition, in one embodiment, to support a RPU cell read and sensing operations (e.g., read a weight value of given RPU cell 110), each block of peripheral circuitry 120 and 130 comprise (i) a pulse-width modulation (PWM) circuit and read pulse driver circuit to generate and apply PWM read pulses to the RPU cells 110, in response to input vector values (read input values) received during forward/backward cycles, and (ii) a current integrator circuit and analog-to-digital (ADC) circuit to integrate read current that is output and accumulated from the connected RPU cells 110 and convert the integrated current into a digital value (read output value) for subsequent computation.

The data I/O interface 125 provides an interface that is configured to (i) receive external control signals and apply update and read input values to the blocks of peripheral circuitry 120, and (ii) receive digital read output values from the blocks of peripheral circuitry 120, and send the digital read output signals to a remote element for processing. Similarly, the data I/O interface 135 provides an interface that is configured to (i) receive external control signals and apply update and read input values to the blocks of peripheral circuitry 130, and (ii) receive digital read output values from the blocks of peripheral circuitry 130, and send the digital read output signals to a remote element for processing.

Each RPU cell 110 in the RPU system 100 comprises a resistor-like circuit component with a tunable conductance, wherein the conductance value of each RPU cell 110 represents a matrix element or weight. For example, in some embodiments, the RPU cells 110 can be implemented using a variable resistance device such as a resistive memory element used in resistive random-access memory (RRAM) systems. In other embodiments, the RPU cells 110 can be implemented using an analog CMOS framework comprising a capacitor and one or more read transistors, wherein the capacitor serves as a memory element in the RPU cell which stores a weight value in the form of capacitor voltage. As explained in further detail below, the capacitor voltage, or weight voltage $V_W$, is directly applied to the gate terminal(s) of the read transistor(s) to modulate the channel resistance of the read transistor(s). The charge state stored in the capacitor can be accessed by applying small bias across the read transistor(s) to generate drain currents, which generate a read current, $I_{READ}$, that flows out of RPU cell.

Deep fully connected neural networks are composed of stacking of multiple fully connected layers such that the signal propagates from input layer to output layer by going through series of linear and non-linear transformations. The entire network expresses a single differentiable error function that maps the input data on to class scores at the output layer. Typically, the network is trained with simple stochastic gradient decent (SGD), in which the error gradient with respect to each parameter is calculated using the backpropagation algorithm. The backpropagation algorithm is composed of three cycles, forward, backward and weight update that are repeated many times until a convergence criterion is met. FIGS. 2A, 2B, and 2C schematically illustrate respective forward pass, backward pass, and weight update operations of a backpropagation algorithm which can be performed using the RPU system 100 of FIG. 1.

For a single fully connected layer where N input neurons are connected to M output (or hidden) neurons, the forward pass (FIG. 2A) involves computing a vector-matrix multiplication y=Wx, where the vector x of length N represents the activities of the input neurons and the matrix W of size M×N stores the weight values between each pair of input and output neurons. The resulting vector y of length M is further processed by performing a non-linear activation on each of the elements and then passed to the next layer. Once the information reaches to the final output layer, the error signal is calculated and back propagated through the network. In forward cycle, stored conductance values in the crossbar array of RPU cells 110 form a matrix, whereas the input vector is transmitted as voltage pulses through each of the input rows R1, R2, R3, . . . , Rm.

The backward cycle (FIG. 2B) on a single layer also involves a vector-matrix multiplication on the transpose of a weight matrix, $z=W^T\delta$, where W denotes the weight matrix, where the vector $\delta$ of length M represents the error calculated by the output neurons, and where the vector z of length N is further processed using the derivative of neuron non-linearity and then passed down to the previous layers. In a backward cycle, voltage pulses are supplied to the RPU cells 110 from columns CL1, CL2, CL3, . . . , CLn as an input, and the vector-matrix product is computed on the transpose of the weight matrix W.

Finally, in an update cycle (FIG. 2C), the weight matrix W is updated by performing an outer product of the two vectors that are used in the forward and the backward cycles. In particular, implementing the weight update on a 2D crossbar array of resistive devices locally and all in parallel, independent of the array size, requires calculating a vector-vector outer product which consist of a multiplication operation and an incremental weight update to be performed locally at each cross-point (RPU cell 110) in the RPU system of FIG. 1. As schematically illustrated in FIG. 2C, the weight update process is computed as: $w_{ij} \leftarrow w_{ij} + \eta x_i \times \delta_j$, where $w_{ij}$ represents the weight value for the $i^{th}$ row and the $j^{th}$ column (for simplicity layer index is omitted), where $x_i$ is the activity at the input neuron, $\delta_j$ is the error computed by the output neuron, and where it denoted a global learning rate.

All operations on the weight matrix W can be implemented with using the 2D crossbar array of two-terminal RPU device with M rows and N columns where the stored conductance values in the crossbar array form the matrix W. In the forward cycle, input vector x is transmitted as voltage pulses through each of the columns and the resulting vector y can be read as current signals from the rows. Similarly, when voltage pulses are supplied from the rows as an input in the backward cycle, then a vector-matrix product is computed on the transpose of the weight matrix $W^T$. Finally, in the update cycle, voltage pulses representing vectors x and $\delta$ are simultaneously supplied from the columns and the rows. At this setting, each RPU cell 110 performs a local multiplication and summation operation by processing the voltage pulses coming from the column and the row and hence achieving an incremental weight update.

All three operating modes described above allow the arrays of RPU cells that constitute the network to be active in all three cycles and hence enable a very efficient implementation of the backpropagation algorithm. However, in conventional frameworks, the analog weight storage element in the RPU cell is configured to store weight values, but not the signs (positive or negative) of the weight values. The RPU operations for vector-matrix multiplication and other computations require additional processing outside of the RPU cells to determine if the read-out weight values are positive, zero, or negative weight values. In accordance with embodiments of the invention, RPU cells are designed with in-cell differential reading circuitry that is configured to enable weight reading with sign (positive, negative, zero) so that the weight values that are read out from the RPU cells provide the weight value the sign (e.g., positive, negative, zero) of the weight value.

FIG. 3 conceptually illustrates a process for utilizing a reference current source within an RPU cell to implement a differential read scheme which enables weight values with sign (positive, negative, zero) to be directly read out from the RPU cell, according to an embodiment of the invention. FIG. 3 schematically illustrates that an RPU cell has a tunable conductance 300 which can range from a minimum conductance (G min) to a maximum conductance (G_max). In one embodiment, depending on the implementation, a dynamic range of the tunable conductance can include 1000 values from the lowest conductance state (G min) to the highest conductance state (G_max), and which can be adjusted in an analog and incremental manner. FIG. 3 further illustrates that the conductance can be converted to a current by an applied voltage whereby a current $I_W$ corresponds to a weight value of the RPU cell. In this regard, the RPU cell has a variable current 310 which can range from a minimum current ($I_{W\_min}$) to a maximum current ($I_{W\_max}$), wherein a reference current $I_{REF}$ generated in the RPU cell can be used to implement weight sign.

In particular, as shown in FIG. 3, a read current $I_{READ}$ can be output from an RPU cell to provide a weight value and weight sign, wherein $I_{READ}=I_W-I_{REF}$. With this differential scheme, the magnitude of $I_{READ}$ will indicate a weight value, and the weight sign will depend on the whether $I_W$ is greater than, equal to, or less than, the reference current $I_{REF}$. A positive sign ($I_{READ}>0$) will be obtained when $I_W>I_{REF}$. A zero value ($I_{READ}=0$) will be obtained when $I_W=I_{REF}$. A negative sign ($I_{READ}<0$) will be obtained when $I_W<I_{REF}$.

FIG. 4 schematically illustrates an RPU cell 400 which implements a differential read scheme using a reference current source to enable signed weight values to be directly read out from the RPU cell, according to an embodiment of the invention. The RPU cell 400 comprises control circuitry 410, a weight storage device 420, a read transistor 430, a current source 440, and switch elements S1 and S2. FIG. 4 illustrates an implementation of a CMOS-based RPU framework in which the weight storage device 420 serves as a memory element that stores a weight voltage $V_W$ which corresponds a weight value of the RPU cell 400. The weight storage device 420 may comprise a capacitor, a battery element, or any suitable storage device or circuit that is configured to store a weight voltage $V_W$. In one embodiment, the read transistor 430 comprises an NMOS FET device. The weight storage device 420 is connected to a gate terminal of the read transistor 430. A first source/drain terminal of the read transistor 430 is switchably connected to a first read port P1 of the RPU cell 400 via the switch element S1. The current source 440 generates a fixed reference current $I_{REF}$, and is switchably connected to a second source/drain terminal of the read transistor 430 via the second switch element S2. The second source/drain terminal of the read transistor 430 is connected to a second read port P2 of the RPU cell 400.

The control circuit 410 can be configured using any suitable circuit architecture that is configured to adjust the weight voltage $V_W$ of the weight storage device 420. In the exemplary RPU system 100 of FIG. 1, the control circuitry 410 within the RPU cell would have input ports connected to "update" control lines of the row and column lines RL and CL to receive control signals from the peripheral circuitry 120 and 130 for updating the weight value of the RPU cell. The switch elements would be responsive to sense control signals (generated by the peripheral circuitry 120 and 130 to perform a weight value sensing operation) to connect the first/source drain terminal of the read transistor 430 to the first read port P1, and to connect the current source 440 to the second source/drain terminal of the read transistor 430.

During a sensing operation, the weight voltage $V_W$ is applied to a gate terminal of the read transistor 430 to modulate the channel resistance of the read transistor 430 and generate a weight current $I_W$ which corresponds to the weight voltage $V_W$. With the fixed current source 440 connected to the second source/drain terminal of the read transistor 430, a read current $I_{READ}$ output from the second port P2 of the RPU cell 400 comprises a value of $I_W-I_{REF}$. As noted above, with this differential scheme, since the value of the reference current $I_{REF}$ is a known fixed value, the weight sign be deemed positive when the read current $I_{READ}$ is greater than zero, and the weight singe will be deemed negative when the read current $I_{READ}$ is less than zero.

While FIGS. 3 and 4 schematically illustrate the concept of implementing a differential read-out scheme using a reference current source to enable signed weight values to be directly read out from the RPU cell, this concept can be extended to an in-cell complementary read out scheme comprising a differential weight read-out framework, as will be explained in further detail with reference to FIGS. 5 and 6. With a differential weight read-out framework, two current reading elements are utilized which operate in a complementary manner, which serves to increase the dynamic range 2x more than the single element reading scheme discussed above with reference to FIGS. 3 and 4.

Figure 5:
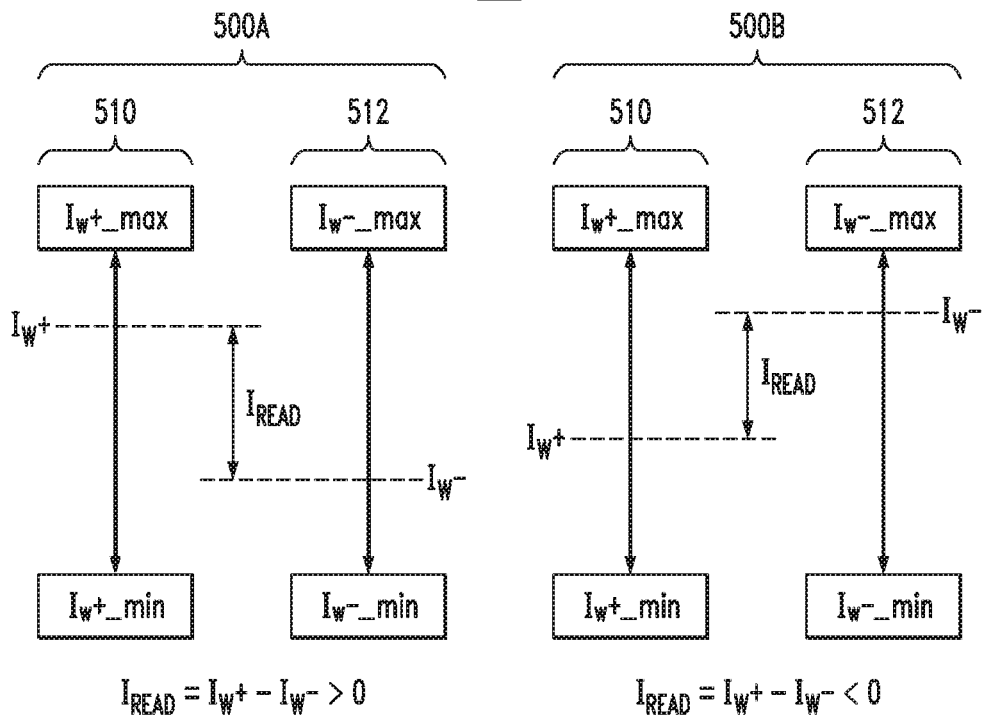
FIG. 5 conceptually illustrates an in-cell complementary differential read scheme to enable signed weight values to be directly read out from an RPU cell, according to an embodiment of the invention.

FIG. 5 conceptually illustrates an in-cell complementary reading scheme 500 which implements a differential weight read-out process to enable signed weight values to be directly read out from an RPU cell, according to an embodiment of the invention. In particular, FIG. 5 conceptually illustrates an RPU cell comprising a first reading element 510 which generates a first (positive) weight current $I_W^+$, and a second reading element 512 which generates a second (negative) weight current $I_W^-$ that is complementary to the first weight current $I_W^+$. In this conceptual embodiment, it is assumed that the first (positive) weight current $I_W^+$ can range from a minimum current ($I_W^+$_min) to a maximum current ($I_W^+$_max) based on a value of a weight voltage $V_W$, and the second (negative) weight current $I_W^-$ can range from a minimum current ($I_W^-$_min) to a maximum current ($I_W^-$_max) based on the value of the weight voltage $V_W$.

FIG. 5 conceptually illustrates the in-cell complementary reading scheme 500 being configured to generate a read current $I_{READ}$ having a weight value $I_{READ}=I_W^+-I_W^-$, a weight sign which depends on the whether the first current $I_W^+$ is greater than, equal to, or less than, the second current $I_W^-$. In particular, FIG. 5 conceptually illustrates a first state 500A of the complementary reading scheme 500 in which a positive sign of the weight value is obtained when $I_W^+$ is greater than $I_W^-$ (i.e., $I_{READ}=I_W^+-I_W^->0$), and a second 500B state in which a negative sign of the weight value is obtained when $I_W^+$ is less than $I_W^-$ (i.e., $I_{READ}=I_W^+-I_W^-<0$). A zero value ($I_{READ}=0$) will be obtained when $I_W^+=I_W^-$.

Figure 6:
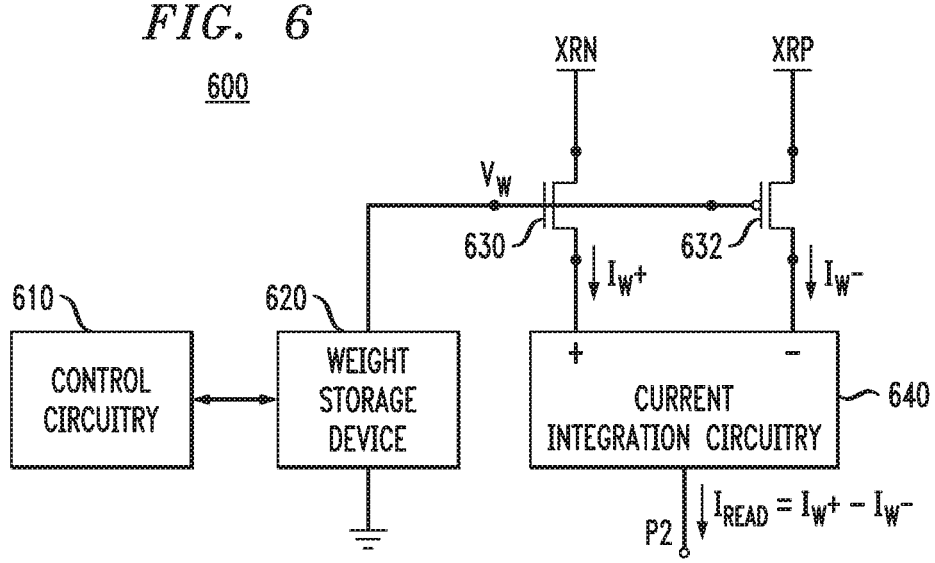
FIG. 6 schematically illustrates an RPU cell which comprises an in-cell complementary reading circuit that implements a differential weight read-out process to enable signed weight values to be directly read out from the RPU cell, according to an embodiment of the invention.

FIG. 6 schematically illustrates an RPU cell 600 which comprises an in-cell complementary reading circuit that implements a differential weight read-out process to enable signed weight values to be directly read out from the RPU cell 600, according to an embodiment of the invention. The RPU cell 600 comprises control circuitry 610, a weight storage device 620, a first read transistor 630, a second read transistor 632, and current integration circuitry 640. Similar to the RPU cell frameworks discussed above with reference to FIG. 5, the RPU cell 600 of FIG. 6 implements a CMOS-based RPU framework in which the weight storage device 620 serves as a memory element that stores a weight voltage $V_W$ which corresponds a weight value of the RPU cell 600. The weight storage device 620 may comprise a capacitor, a battery element, or any suitable storage device or circuit that is configured to store a weight voltage $V_W$.

In one embodiment, the first read transistor 630 comprises an NMOS FET device, and the second read transistor 632 comprises a PMOS FET device. The first and second read transistors 630 and 632 have gate terminals that are commonly connected to the weight storage device 620 such that during a sensing operation, the weight voltage $V_W$ is concurrently applied to the gate terminals of the first and second read transistors 630 and 632 The first and second read transistors have first source/drain terminals that are connected to separate read control lines XRN and XRP, respectively, and second source/drain terminals that are connected to the current integration circuit 640.

The control circuit 610 can be configured using any suitable circuit architecture that is configured to adjust the weight voltage $V_W$ of the weight storage device 620. In the exemplary RPU system 100 of FIG. 1, the control circuitry 610 within the RPU cell would have input ports connected to "update" control lines of the row and column lines RL and CL to receive control signals from the peripheral circuitry 120 and 130 for updating the weight value of the RPU cell. The read sensing lines XRN and XRP would apply complementary sense control signals to the first source/drain terminals of the first and second read transistors 630 and 632, the complementary sense control signals being generated by the peripheral circuitry 120 and 130 to perform a weight value sensing operation).

During a sensing operation, the weight voltage $V_W$ is applied to gate terminals of the first and second read transistors 630 and 632 to modulate the channel resistance of the first and second read transistors 630 and 632 to generate respective weight currents $I_W^+$ and $I_W^-$, which correspond to the weight voltage $V_W$. The current integration circuitry 640 is configured to generate and output the read current $I_{READ}$ (from output port P2) based on a difference between the input differential weight currents $I_W^+$ and $I_W^-$ (i.e., $I_{READ}=I_W^+-I_W^-$). The current integration circuitry 640 can be implemented using any suitable circuit framework which is configured to add, subtract, or otherwise integrate the input differential weight currents $I_W^+$ and $I_W^-$ to generate the read current $I_{READ}$, which provides a signed weight value of the RPU cell 600.

Figure 7:
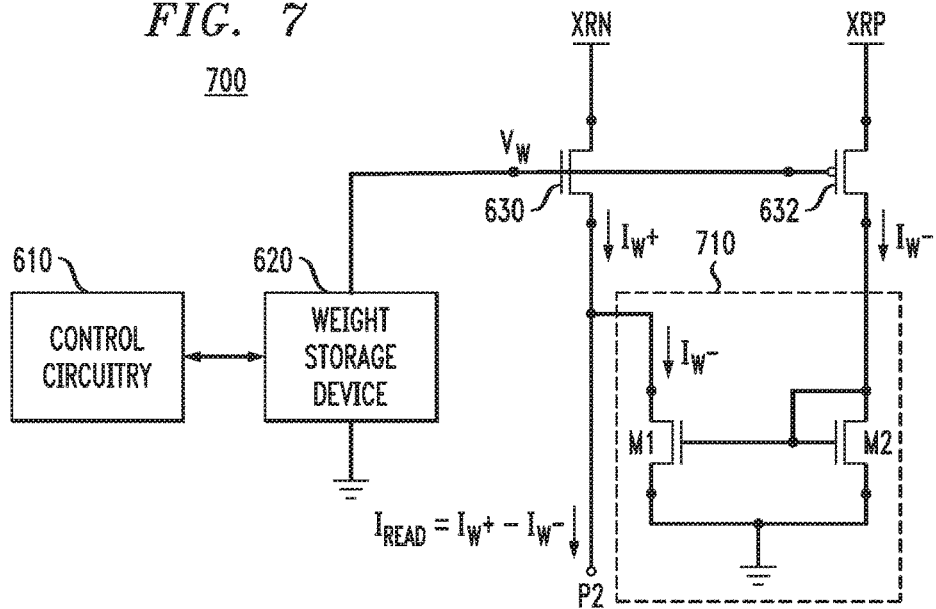
FIG. 7 schematically illustrates an RPU cell which comprises an in-cell complementary reading circuit that implements a differential weight read-out process to enable signed weight values to be directly read out from the RPU cell, according to another embodiment of the invention.

FIG. 7 schematically illustrates an RPU cell 700 which comprises an in-cell complementary reading circuit that implements a differential weight read-out process to enable signed weight values to be directly read out from the RPU cell 700, according to another embodiment of the invention. The RPU cell 700 is similar to the RPU cell 600 discussed above with reference to FIG. 6, except that the RPU cell 700 of FIG. 7 implements a current mirror circuit 710 which is configured to perform an in-cell subtraction function without significantly increasing the footprint of the RPU cell 700. The current mirror circuit 710 provides an example embodiment for implementing the current integration circuitry 640 of FIG. 6.

The current mirror circuit 710 comprises a first NMOS transistor M1 and a second NMOS transistor M2. In one embodiment, the NMOS transistors M1 and M2 are the same size so that they have equal drain currents. In this regard, the complementary weight current $I_W^-$, which is generated in the second read transistor 632 in response to the weight voltage $V_W$ applied to the gate terminal of the second read transistor 632, serves as a reference current for the current mirror circuit 710 and is mirrored in the NMOS transistor M1. In this configuration, the current mirror circuit 710 serves as a current sink which sinks the mirrored current $I_W^-$ from the first current $I_W^+$ which is generated in the first read transistor 630 in response to the weight voltage $V_W$ applied to the gate terminal of the first read transistor 630. As such, the RPU cell 700 outputs a read current $I_{READ}$ (from output port P2) based on a difference between the input differential weight currents $I_W^+$ and $I_W^-$ (i.e., $I_{READ}=I_W^+-I_W^-$).

The in-cell complementary reading circuit framework for differential weight read-out in the RPU cell 700 of FIG. 7 is advantageous for various reasons. For example, the in-cell complementary reading circuit framework effectively enhances the dynamic range by doubling the current difference values due to the differential implementation. Further, no additional cross bar array is required for the reading the complementary currents $I_W^+$ and $I_W^-$. Moreover, the average current flowing through column read lines can be significantly reduced, which enables are larger RPU array size. In addition, the in-cell implementation allows for compensation in transistor variations across the RPU array.

Figure 8:
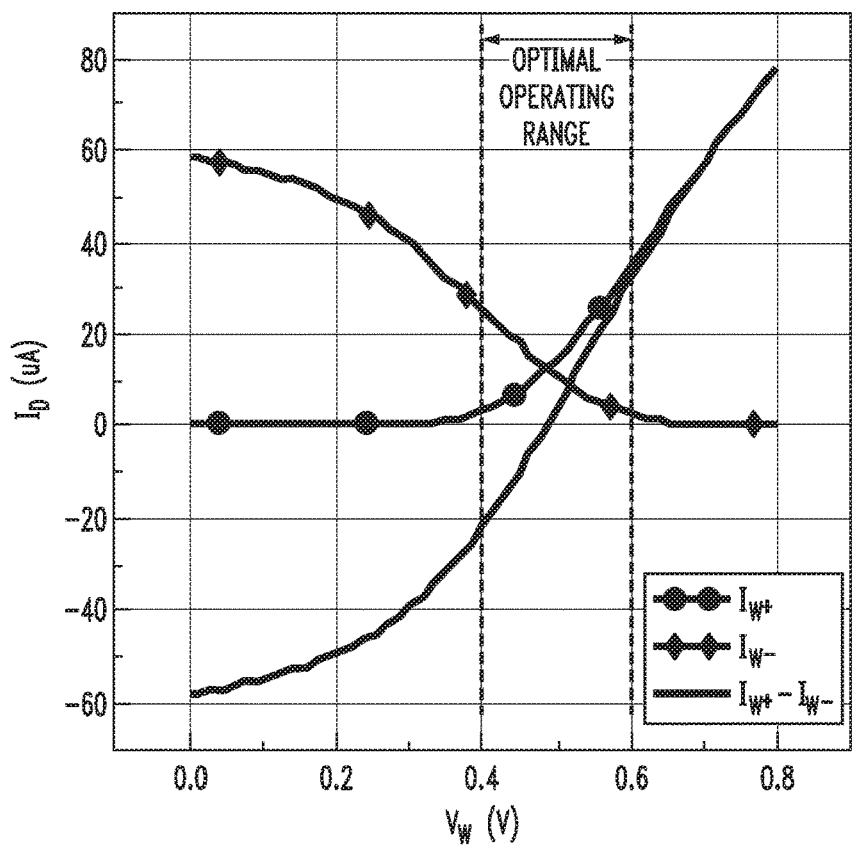
FIG. 8 graphically illustrates computer simulation results showing a complementary differential weight read-out process that is implemented based on the RPU cell architecture shown in FIG. 7.

FIG. 8 graphically illustrates computer simulation results showing a complementary differential weight read-out process that is implemented based on the RPU cell architecture shown in FIG. 7. In particular, FIG. 8 comprises a graph 800 which illustrates simulated curves for weight current $I_W^+$ and $I_W^-$ and a read current $I_{READ}$ ($I_W^+-I_W^-$) (in micro Amps) as a function of weight voltage $V_W$. The simulation results of FIG. 8 were obtained with the first and second read transistors 630 and 632 being modeled to operation in a linear region with drain-source voltage (Vds)=0.3V, threshold voltage (Vth)=0.12V. As shown in FIG. 8, the first weight current $I_W^+$ increases with increasing weight voltage $V_W$, and the second weight current $I_W^-$ decreases with increasing weight voltage $V_W$. FIG. 8 illustrates an optimal operating range of the weight voltage $V_W$ of 0.4V to 0.6V, wherein the wherein $I_{READ}$ ($I_W^+ - I_W^-$) has a linear slope. While FIG. 8 illustrates one example simulation for specific bias and operating voltages, additional computer simulations have shown that the RPU cell architecture of FIG. 7 is robust in operation such that the first and second read transistors can be configured to operate in a saturation region with higher Vds values (e.g., 0.6) while still providing essentially a 1:1 correspondence between current output as a function of weight voltage in a wide operating range.

While the example embodiments of FIGS. 4, 6 and 7 are based on an analog CMOS-based framework using, e.g., weight storage capacitors and read transistors for storing and reading RPU cell weight values, other embodiments of the invention can be implemented using resistor-type analog RPU cells. For example, resistor-type analog RPU cells can be implemented using memristors or resistive memory cells that are utilized in resistive random-access memory (RRAIVI). In particular, as is known in the art, a resistive memory cell comprises a metal-insulator-metal (MIM) structure in which the insulator layer (e.g., metal-oxide) exhibits a variable resistance through a resistive switching behavior.

Figure 9:
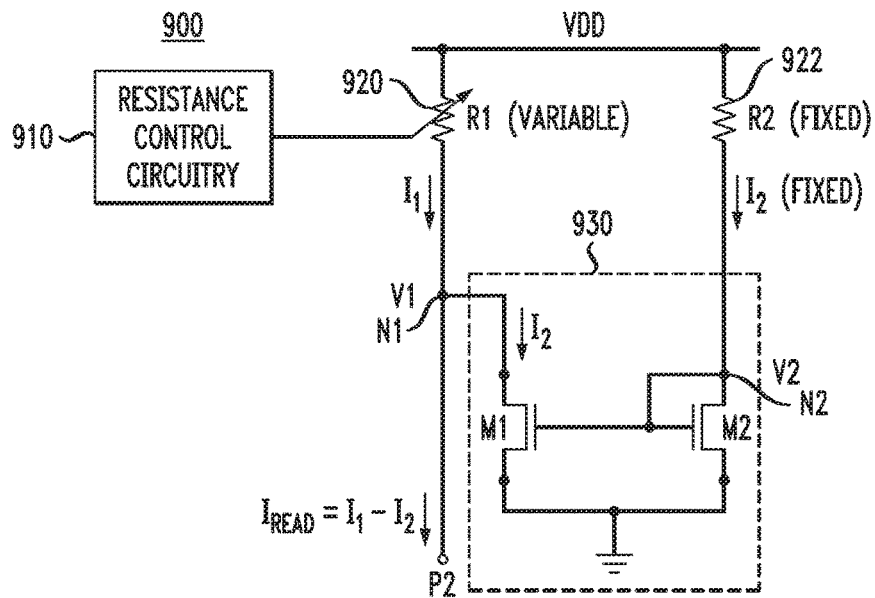
FIG. 9 schematically illustrates a resistor-type RPU cell which comprises an in-cell differential read-out system to enable signed weight values to be directly read out from the RPU cell, according to an embodiment of the invention.

FIG. 9 schematically illustrates a resistor-type RPU cell 900 which comprises an in-cell differential read-out system to enable signed weight values to be directly read out from the RPU cell 900, according to another embodiment of the invention. The RPU cell 900 comprises resistance control circuitry 910, a variable resistance device 920, a first resistance device 922, and a current mirror circuit 930. FIG. 9 illustrates an implementation of a resistor-type RPU cell framework in which the resistance value of the variable resistance device 920 corresponds to the weight value of the RPU cell 900. The variable resistance device 920 may comprise a memristor device or resistive memory cell (e.g., MIM device) having a resistance value that can be modulated (or otherwise adjusted) by the resistance control circuitry 910 using known circuits and methods. The resistance control circuit 910 within the RPU cell would have input ports connected to "update" control lines of the row and column lines RL and CL to receive control signals from the peripheral circuitry 120 and 130 for updating the weight value of the RPU cell 900 by adjusting the resistance value of the variable resistance device 920.

The variable resistance device 920 generates a variable current $I_1$ based on a control voltage (e.g., VDD) applied to a row control line (RL) attached to the RPU cell 900, wherein the value of current $I_1$ corresponds to the weight value of the RPU cell 900. The fixed resistance device 930 generates a fixed current $I_2$ based on the control voltage (e.g., VDD) applied to the row control line (RL) attached to the RPU cell 900, wherein the fixed current $I_2$ serves as a fixed reference current.

Similar to the current mirror 710 discussed above with reference to FIG. 7, the current mirror circuit 930 in FIG. 9 comprises a first NMOS transistor M1 and a second NMOS transistor M2. In one embodiment, the NMOS transistors M1 and M2 are the same size so that they have equal drain currents. In this regard, the fixed reference current $I_2$, which flows through the fixed resistor device 922, serves as a reference current for the current mirror circuit 930 and is mirrored in the NMOS transistor M1. In this configuration, the current mirror circuit 930 serves as a current sink which sinks (subtracts) the mirrored current $I_2$ from the variable current $I_1$ which flows from the variable resistance device 920. As such, the RPU cell 900 outputs a read current $I_{READ}$ from the output port P2, wherein the read current $I_{READ}$ represents a difference between the variable current $I_1$ and the fixed reference current $I_2$ (i.e., $I_{READ}=I_1-I_2$). In this regard, similar to the schemes discussed above, the sign of RPU cell weight is deemed positive when the read current $I_{READ}$ is greater than zero, and the sign of the RPU cell weight is deemed negative when the read current $I_{READ}$ is less than zero.

Figure 10:
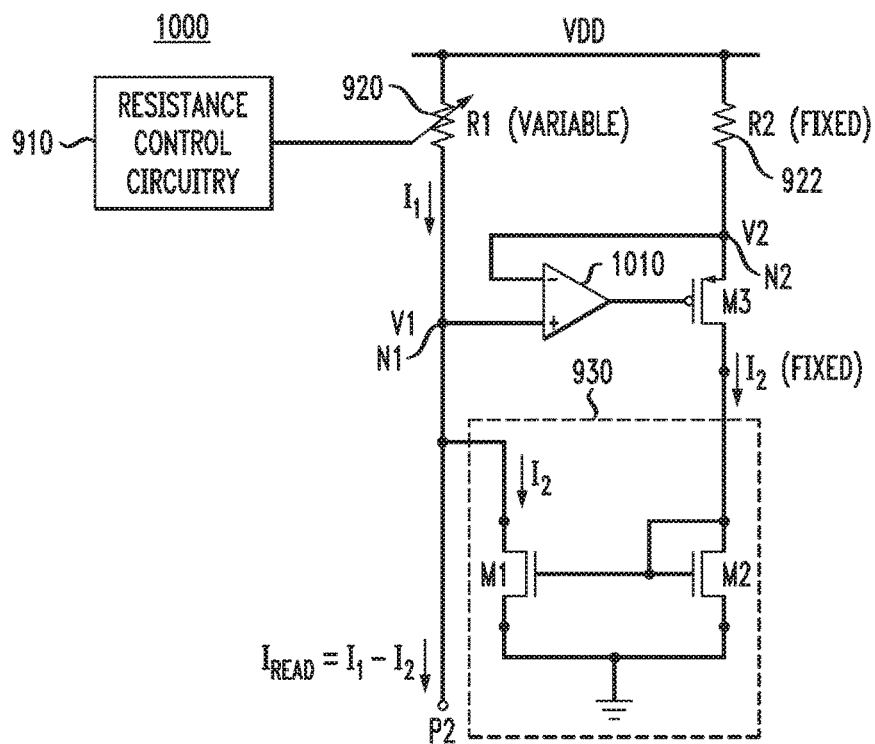
FIG. 10 schematically illustrates a resistor-type RPU cell which comprises an in-cell differential read-out system to enable signed weight values to be directly read out from the RPU cell, according to another embodiment of the invention.

With the circuit configuration shown in FIG. 9, it is desirable that a voltage V1 at node N1 be equal to a voltage V2 at node N2 (i.e., V1=V2). However, the voltage V2 at node N2 may vary ±100 mV, which causes a slight variation in the reference current $I_2$. To address this variation, additional circuitry can be implemented in the RPU cell 900 of FIG. 9 to prevent variation in the fixed reference current $I_2$. For example, FIG. 10 schematically illustrates a resistor-type RPU cell 1000 which comprises an in-cell differential read-out system to enable signed weight values to be directly read out from the RPU cell 1000, according to another embodiment of the invention. The RPU cell 1000 of FIG. 10 is similar to the RPU cell 900 of FIG. 9 except that a PMOS transistor M2 and an operational amplifier 1010 are incorporated with the RPU cell 1000 to prevent or significantly limit the voltage variation between nodes N1 and N2 and thereby prevent variation in the fixed reference current $I_2$ that is input to the current mirror circuit 930.

The PMOS transistor M3 is serially connected between the fixed resistor device 922 and a reference input node of the current mirror circuit 930. A gate terminal of the PMOS transistor M3 is connected to an output of the operational amplifier 1010. The operational amplifier 1010 comprises a non-inverting input (+) connected to the node N1, and an inverting input (−) connected to the node N2, wherein the output of the operational amplifier 1010 is proportional to $V^+-V^-$ (i.e., the difference between the voltage applied to the non-inverting and inverting inputs). The operational amplifier 1010 serves to maintain the voltage V2 at node N2 equal to the voltage V1 at node N1, and maintain the current $I_2$ which flows through the PMOS transistor M3 to remain at a fixed reference value (with no or insubstantial variation).

Figure 11:
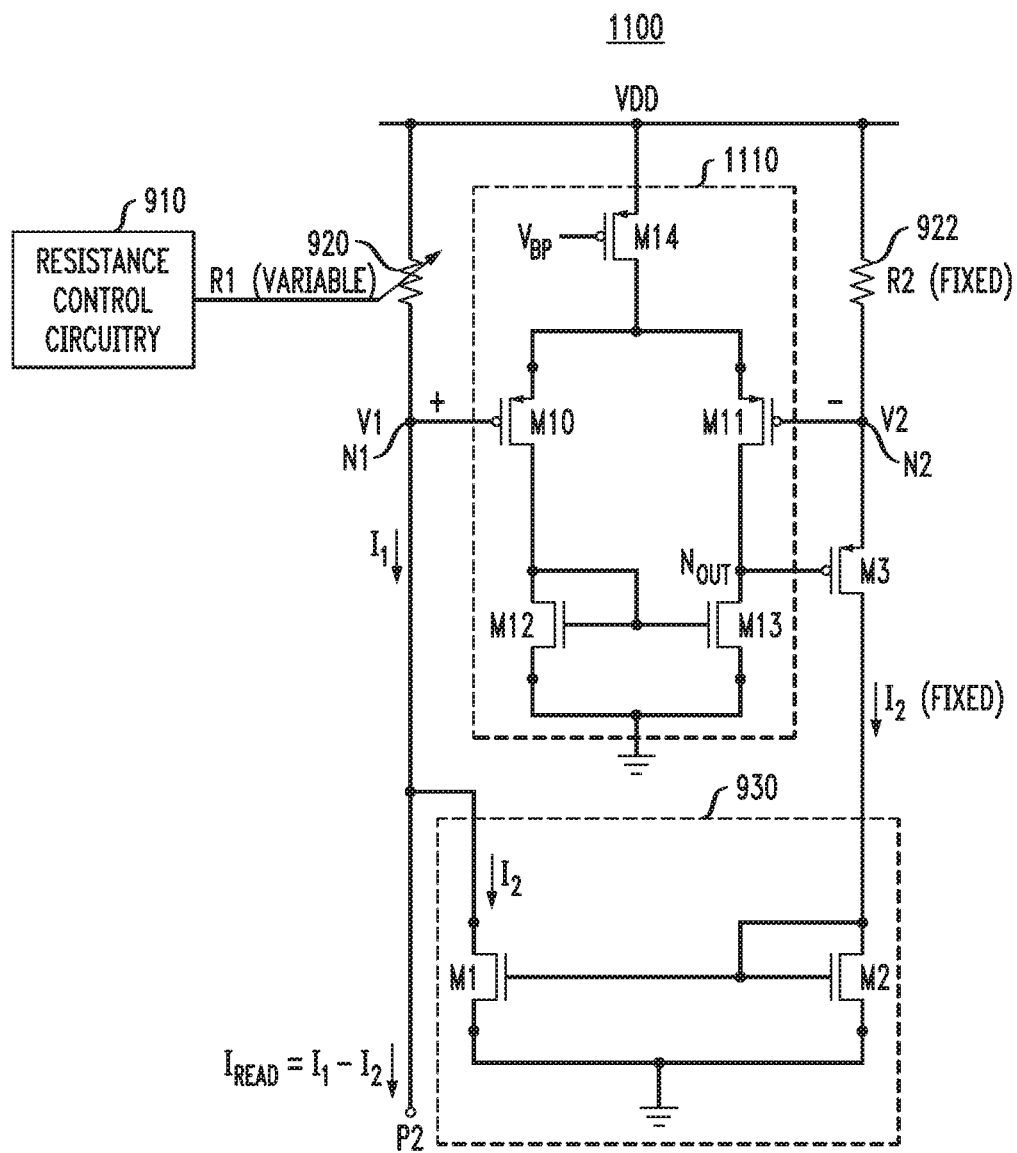
FIG. 11 schematically illustrates a resistor-type RPU cell which comprises an in-cell differential read-out system to enable signed weight values to be directly read out from the RPU cell, according to another embodiment of the invention.

FIG. 11 schematically illustrates a resistor-type RPU cell 1100 which comprises an in-cell differential read-out system to enable signed weight values to be directly read out from the RPU cell 1100, according to another embodiment of the invention. The RPU cell 1100 of FIG. 11 is similar to the RPU cell 1000 of FIG. 10, but FIG. 11 illustrates an example circuit configuration of the operational amplifier 1010 of FIG. 10. In particular, FIG. 11 illustrates an embodiment of an operational amplifier 1110 comprising transistors M10, M11, M12, M13 and M14. The transistors M10 and M11 comprise PMOS transistors which form a differential input circuit, wherein a gate terminal of the PMOS transistor M10 comprises a non-inverting input of the operational amplifier 1110, which is connected to the node N1, and wherein a gate terminal of the PMOS transistor M11 comprises an inverting input of the operational amplifier 1110, which is connected to the node N2. The transistors M12 and M13 comprises NMOS transistors which form a current mirror load for the operational amplifier 1110. The transistor M14 comprises a PMOS transistor which serves as a constant current biasing transistor for the operational amplifier 1110. A bias voltage VBP from a global biasing circuit is applied to the gate terminal of the transistor M14. An output node $N_{OUT}$ of the operational amplifier 1110 is connected to the gate terminal of the PMOS transistor M3.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A device, comprising:
   a resistive processing unit (RPU) cell comprising differential read-out circuitry which is configured to generate a read current based on a weight of the RPU cell, wherein the weight of the RPU cell comprises a weight value and a weight sign;
   wherein the differential read-out circuitry is configured to generate the read current as a difference between a first current and a second current;
   wherein the read current comprises a magnitude and sign which represent the weight value and the weight sign, respectively, of the RPU cell;
   wherein the sign of the read current is deemed positive when the first current is greater than the second current; and
   wherein the sign of the read current is deemed negative when the first current is less than the second current.

2. The device of claim 1, wherein the sign of the read current is deemed zero when the first current is equal to the second current.

3. The device of claim 1, wherein the RPU cell further comprises a weight storage device configured to store a weight voltage which represent the weight of the RPU cell.

4. The device of claim 3, wherein the weight storage device comprises a capacitor, and wherein the RPU cell further comprises control circuitry to update the weight voltage stored in the capacitor.

5. The device of claim 3, wherein the differential read-out circuitry of the RPU cell comprises a read transistor, wherein the read transistor is configured to generate the first current in response to the stored weight voltage applied to a gate terminal of the read transistor, and wherein the second current comprises a fixed reference current.

6. The device of claim 5, wherein the read transistor comprises a first source/drain terminal coupled to a first port of the RPU cell, and a second source/drain terminal coupled to a second port of the RPU cell, wherein the gate terminal of the read transistor is coupled to the weight storage device, wherein the RPU cell further comprises a current source coupled to the second source/drain terminal of the read transistor, wherein the current source is configured to generate the fixed reference current, and wherein the read current is output from the second port of the RPU cell.

7. The device of claim 6, wherein the read transistor comprises an NMOS device and wherein the current source is coupled to a source terminal of the read transistor, wherein the current source serves as a current sink to sink the fixed reference current from the source terminal of the read transistor.

8. The device of claim 3, wherein the differential read-out circuitry of the RPU cell comprises:
   a first read transistor configured to generate the first current in response to the stored weight voltage applied to a gate terminal of the first read transistor;
   a second read transistor configured to generate the second current in response to the stored weight voltage applied to a gate terminal of the second read transistor; and
   current integration circuitry configured to generate the read current as a difference between the first current and the second current.

9. The device of claim 8, wherein the first and second currents are complementary currents.

10. The device of claim 8, wherein the first read transistor comprises an NMOS device, wherein the second read transistor comprises a PMOS device, wherein the gate terminals of the first and second read transistors are commonly connected.

11. The device of claim 8, wherein:
    the first read transistor comprises a first source/drain terminal coupled to a first port of the RPU cell, and a second source/drain terminal coupled to a first node of the current integration circuitry;
    the second read transistor comprises a first source/drain terminal coupled to a second port of the RPU cell, and a second source/drain terminal coupled to a second node of the current integration circuitry; and
    the current integration circuitry comprises an output terminal coupled to a third port of the RPU cell, wherein the current integration circuitry is configured to generate and output the read current to the third port of the RPU cell.

12. The device of claim 8, wherein the current integration circuitry comprises a current mirror circuit.

13. The device of claim 12, wherein the current mirror circuit comprises:
    a reference node coupled to the second source/drain terminal of the second read transistor; and
    an output node commonly coupled to the second source/drain terminal of the first read transistor and the third port of the RPU cell;
    wherein the current mirror circuit is configured to mirror the second current, which flows from the second source/drain terminal of the second read transistor into the reference node, and sink the mirrored second current into the output node of the current mirror circuit such that the read current is generated as a difference between the first current and the mirrored second current.

14. The device of claim 1, wherein the differential read-out circuitry of the RPU cell comprises:
    a current mirror circuit comprising a reference node and an output node;
    a variable resistor device having a resistance value which corresponds to the weight of the RPU cell, wherein the variable resistor device is coupled between a first port and a second port of the RPU cell, and coupled to the output node of the current mirror circuit; and
    a fixed resistor device having a fixed resistance value, wherein the fixed resistor device is coupled between the first port of the RPU cell and the reference node of the current mirror circuit;
    wherein the variable resistor device is configured to generate the first current in response to a control voltage applied to the first port of the RPU cell;
    wherein the fixed resistor device is configured to generate the second current in response to the control voltage applied to the first port of the RPU cell; and
    wherein the current mirror circuit is configured to mirror the second current, and sink the mirrored second current into the output node of the current mirror circuit to generate the read current which is output from the second port of the RPU device, wherein the read current is generated as a difference between the first current and the mirrored second current.

15. The device of claim 14, wherein the RPU cell further comprises voltage equalization circuitry which is configured to maintain equal voltage levels at the reference node and the output node of the current mirror circuit.

16. The device of claim 15, wherein the voltage equalization circuitry comprises:
- a PMOS transistor serially connected between the fixed resistor device and the reference node of the current mirror circuit; and
- an operational amplifier having an output coupled to a gate terminal of the PMOS transistor, an inverting input coupled to a node between the fixed resistor device and a source/drain terminal of the PMOS device, and a non-inverting input coupled to the output node of the current mirror circuit.

17. The device of claim 16, wherein the operational amplifier comprises:
- a differential input stage;
- a current mirror which is configured to provide a load for the differential input stage; and
- a constant current biasing transistor which is configured to bias the differential input stage of the operational amplifier.

18. The device of claim 14, wherein the RPU cell further comprises control circuitry which is configured to adjust a resistance value of the variable resistor device to update the weight of the RPU cell.

19. The device of claim 1, wherein the device comprises an RPU crossbar array system comprising an array of RPU cells.

20. A device comprising:
- an array of resistive processing unit (RPU) cells; and
- control circuitry configured to control the array of RPU cells, wherein the control circuitry is configured to read and update weights of selected RPU cells in the array of RPU cells;
- wherein each RPU cell in the array of RPU cells comprises differential read-out circuitry which is configured to generate a read current based on a weight of the RPU cell, wherein the weight of the RPU cell comprises a weight value and a weight sign;
- wherein the differential read-out circuitry is configured to generate the read current as a difference between a first current and a second current;
- wherein the read current comprises a magnitude and sign which represent the weight value and the weight sign, respectively, of the RPU cell;
- wherein the sign of the read current is deemed positive when the first current is greater than the second current; and
- wherein the sign of the read current is deemed negative when the first current is less than the second reference current.

* * * * *